United States Patent [19]
Sutphin, Jr.

[11] 3,978,416
[45] Aug. 31, 1976

[54] FILTER WHICH TRACKS CHANGING FREQUENCY OF INPUT SIGNAL

[75] Inventor: Eldon Marvin Sutphin, Jr., Merrimack, N.H.

[73] Assignee: RCA Corporation, New York, N.Y.

[22] Filed: Apr. 30, 1975

[21] Appl. No.: 573,034

[52] U.S. Cl. ............................... 328/167; 328/141; 324/78 J; 324/78 F; 307/233 R; 307/261
[51] Int. Cl.² .......................................... H03B 1/04
[58] Field of Search ....................... 307/261, 233 R; 328/155, 167, 140, 141; 324/78 J, 78 F

[56] References Cited
UNITED STATES PATENTS

| | | | |
|---|---|---|---|
| 3,568,077 | 3/1971 | Fujimoto | 328/155 |
| 3,571,627 | 3/1971 | Cardon | 328/167 X |
| 3,601,707 | 8/1971 | Bauer | 307/261 X |
| 3,714,588 | 1/1973 | Deboo et al. | 328/167 |

*Primary Examiner*—John S. Heyman
*Attorney, Agent, or Firm*—Edward J. Norton; Carl V. Olson

[57] ABSTRACT

A tracking band-pass filter useful for locking onto, and passing, an input signal which changes rapidly in frequency. The filter has a frequency pass band controlled by a voltage which is derived from the output signal passed by the filter. The output signal is translated from a sine wave to a pulse wave. The period between each two successive pulses is measured by counting the cycles of a oscillator during each respective period. An inverter translates the time-representing count signal to a corresponding frequency-representing voltage which is applied to the filter to control its frequency pass band.

7 Claims, 5 Drawing Figures

FILTER WHICH TRACKS CHANGING FREQUENCY OF INPUT SIGNAL

BACKGROUND OF THE INVENTION

Tracking filters are known which have a frequency pass band that tracks or follows the changing frequency of a signal applied to the input of the filter. Such tracking filters include an active filter and feedback means to control the frequency pass band of the filter in accordance with the frequency of the output signal from the filter. Known tracking filters are limited in their ability to track a noisy input signal which changes rapidly in frequency and which changes in frequency over a large range.

SUMMARY OF THE INVENTION

A tracking band-pass filter capable of tracking an input signal having a rapidly changing frequency includes an active filter having a frequency control terminal. The output sine wave signal from the filter is translated to a pulse wave. The time period between successive pulses is measured by digital means to provide a period-representing voltage which is then inverted to provide a frequency-representing voltage. The frequency-representing voltage is obtained very quickly in the period of one cycle of the signal passed by the filter, and is applied to the frequency control terminal of the filter.

DESCRIPTION OF THE PREFERRED EMBODIMENT

Figure 1:
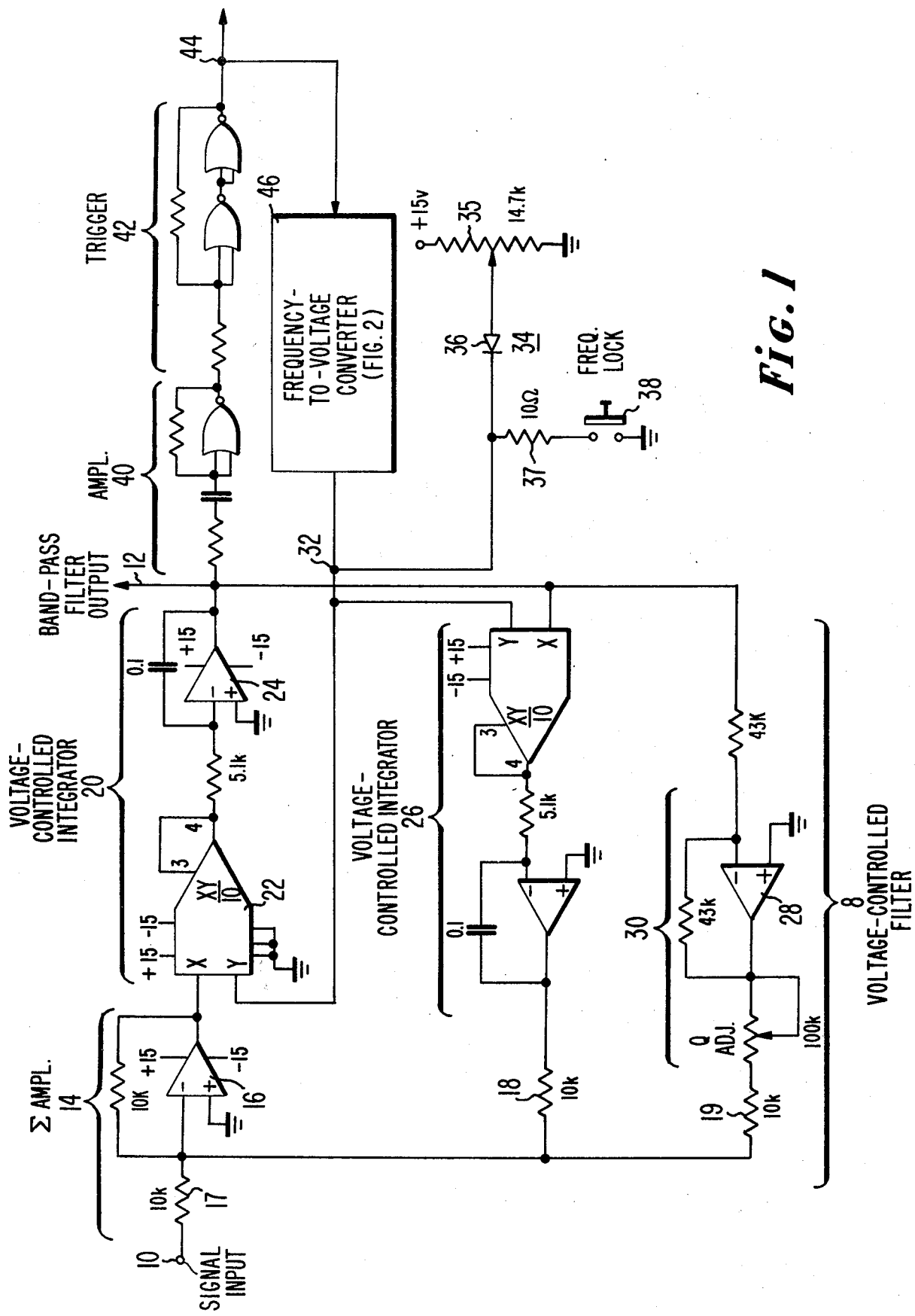
FIG. 1 is a system diagram of a tracking filter constructed according to the teachings of the invention.

Reference is now made in greater detail to the tracking filter of FIG. 1. The tracking filter includes a voltage-controlled filter 8 having a signal input terminal 10 and a signal output terminal 12. The input terminal 10 is connected to a summation amplifier 14 consisting of an operational amplifier 16 connected as an inverting gain amplifier having summation input resistors 17, 18 and 19. Inverting gain amplifiers are described at page 172 of "Operational Amplifiers-Design and Applications" edited by Tobey, Graeme and Huelsman and published by McGraw-Hill in 1971. The operational amplifier 16, and other operational amplifiers in FIG. 1 may be constituted by one-half of a Motorola MC1458 operational amplifier unit.

The output of summation amplifier 14 is connected to an input X of a voltage-controlled integrator 20 including a multiplier 22, and an operational amplifier 24 connected as an integrator in a manner described at page 212 of the above-mentioned book. The multiplier 22 may be a Type AD532 manufactured by Analog Devices, and may be any multiplier described in pages 268–281 of the above-mentioned book. The output 12 of the integrator is connected in a feedback path consisting of a voltage-controlled integrator 26 like integrator 20 and in a parallel feedback path consisting of an operational amplifier 28 connected as an inverting gain amplifier 30. The amplifier 30 is connected as a constant-Q circuit operating to maintain constant the Q of the voltage-controlled filter.

The Y inputs of the multipliers in voltage-controlled integrators 20 and 26 are connected to a frequency control terminal 32 to which a control voltage is supplied to control the frequency pass band of the voltage-controlled filter 8. The control voltage is initially provided by a circuit 34 at a low value to cause the filter to have a low frequency pass band and to provide initial lock. The circuit 34 provides a low voltage at 32 by current flowing from the +15v. terminal through potentiometer 35, diode 36, resistor 37 and switch 38. If the frequency of the input signal applied to terminal 10 increases, a higher control voltage is supplied to terminal 32 by the action of a class A amplifier 40, a trigger circuit with hysteresis or limiting amplifier 42 producing a square wave at 44, and frequency-to-voltage converter 46. The amplifier elements may be contained in RCA CD4001AE integrated circuit units.

Figure 3:
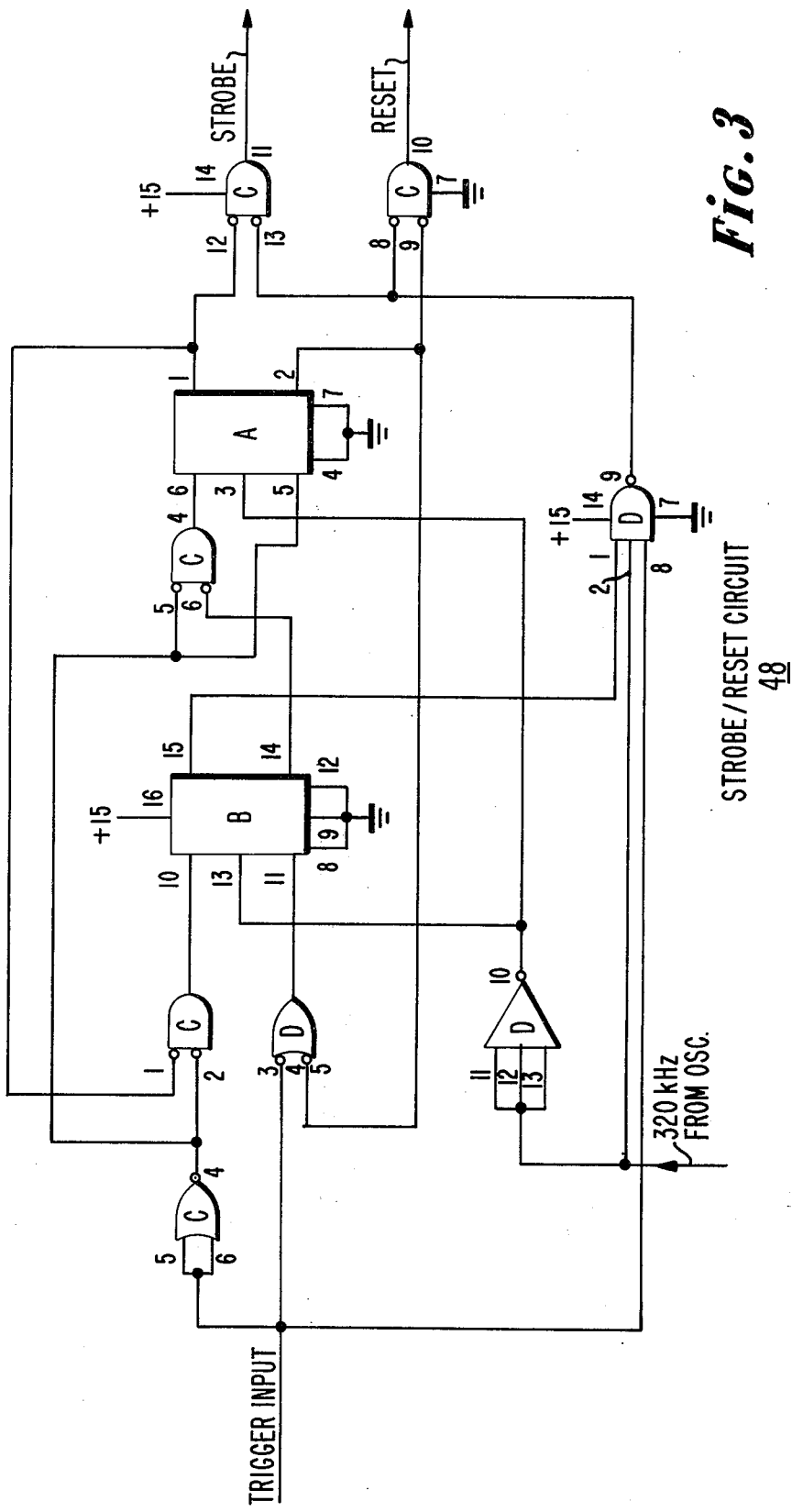
FIG. 3 is a circuit diagram of a strobe/reset circuit included in the block diagram of FIG. 2.
Figure 4:
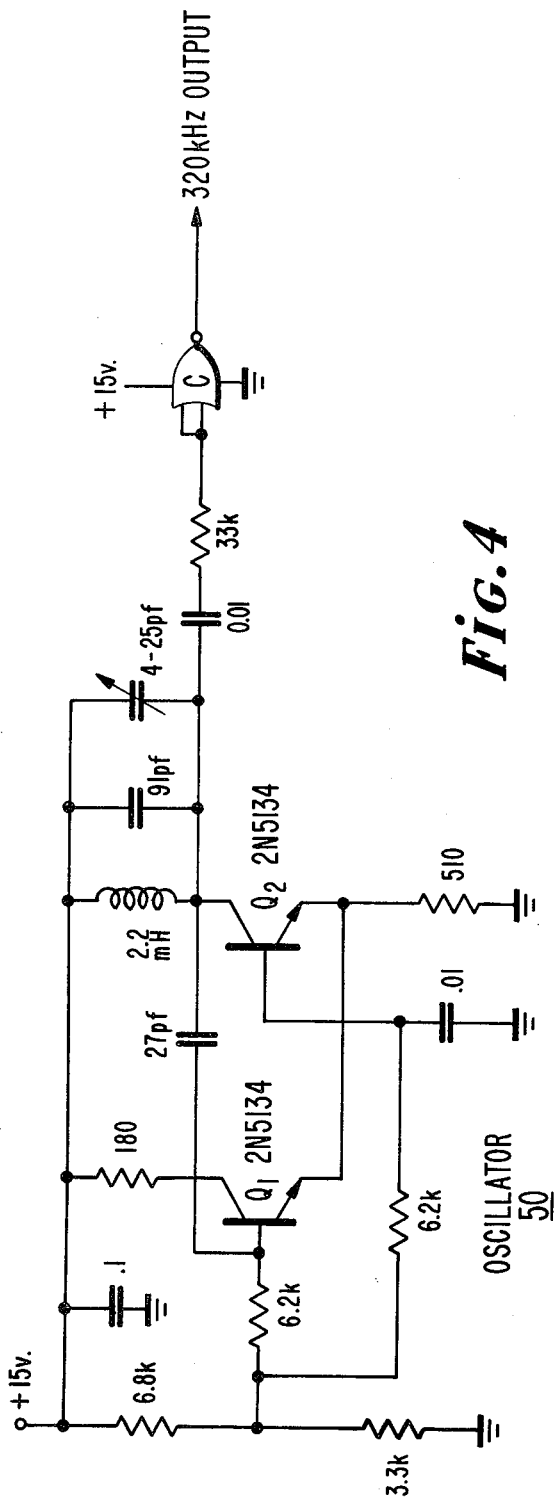
FIG. 4 is a circuit diagram of an oscillator included in the block diagram of FIG. 2.

The total transfer function of the tracking filter shown in FIG. 1 is:

$$H_{(s)} = \frac{\frac{KVS}{10RCQ}}{S^2 + \frac{VS}{10RCQ} + \left(\frac{V}{10RC}\right)^2}$$

where:
$S = $ LaPlace operator
$Q = $ (Center frequency/Bandwidth)
$K = $ Gain at center frequency
$RC = $ (1/Natural frequency)
$V = $ Control voltage The frequency-to-voltage converter 46 in FIG. 1 is shown in detail in FIG. 2. The input 44 of the converter is connected to a strobe/reset circuit 48 which also receives a 320 KHz square wave from an oscillator 50. The circuit 48 produces a strobe output pulse at 52, and shortly thereafter a reset output pulse at 54. The strobe and reset pulses occur once per cycle of the trigger input, which may have a repetition rate of a few hundred pulses or cycles per second. The strobe and reset pulses each have the duration of a half cycle of the square wave from the 320 KHz oscillator. The strobe/reset circuit may have a detailed circuit diagram as shown in FIG. 3, where JK flip-flops A and B are an RCA CD4027AE unit, gates C are an RCA CD4001AE unit and gates D are an RCA CD4023AE unit. The oscillator 50 may have a detailed circuit diagram as shown in FIG. 4.

Figure 2:
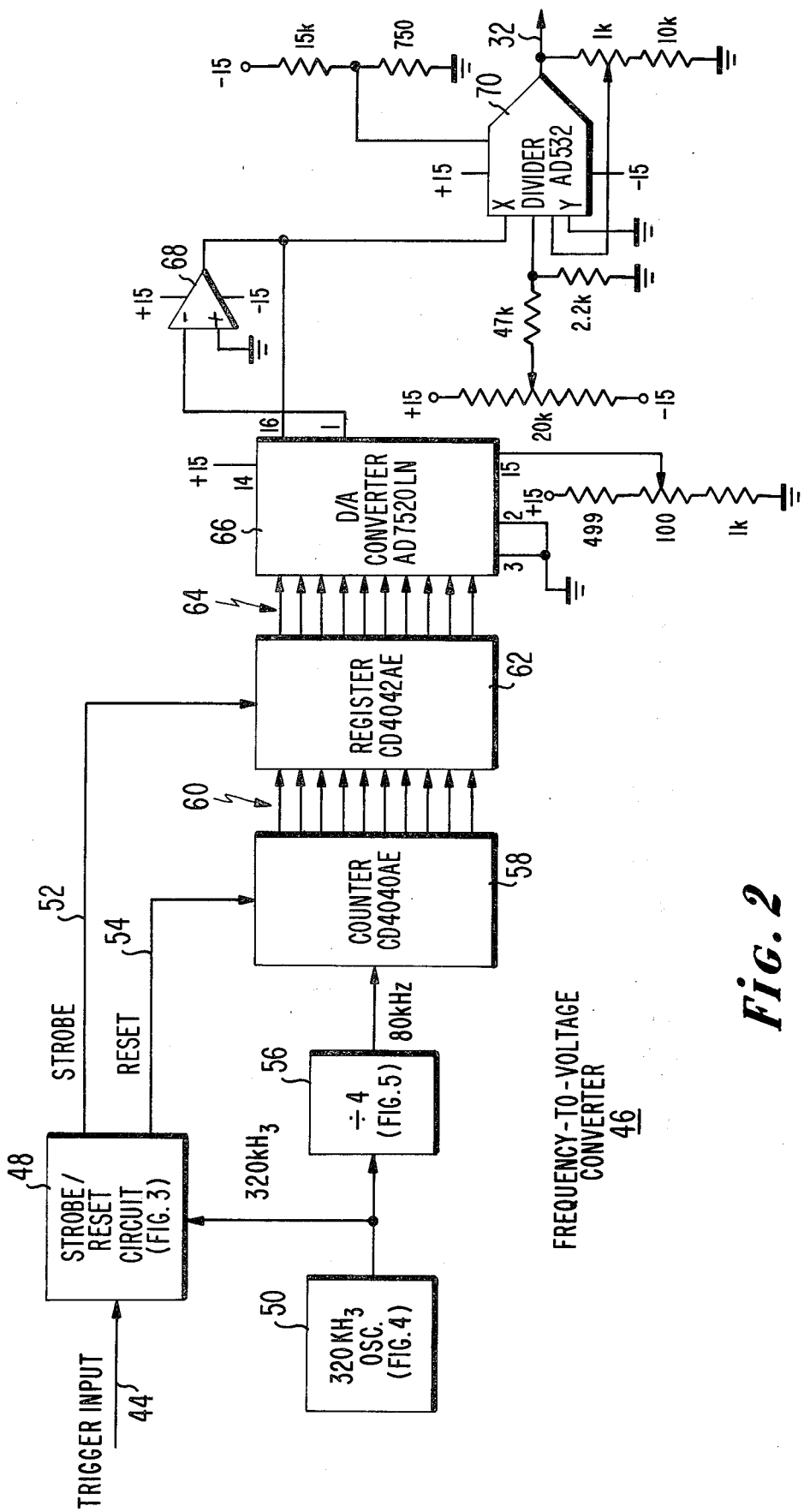
FIG. 2 is a block diagram of a frequency-to-voltage converter included in the system of FIG. 1.
Figure 5:
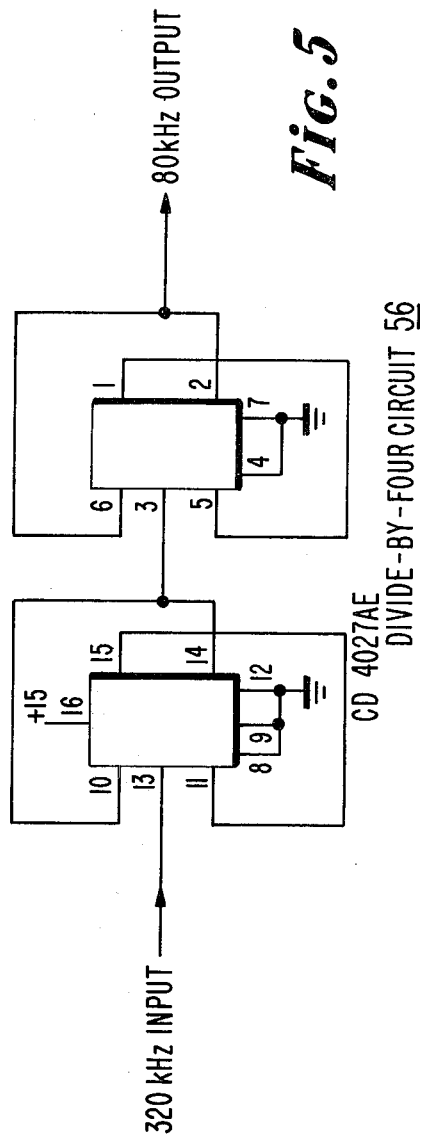
FIG. 5 is a circuit diagram of a divide-by-four circuit included in the block diagram of FIG. 2.

The frequency-to-voltage converter of FIG. 2 includes a divide-by-four circuit 56 which divides the 320 KHz square wave from oscillator 50 to a 80 KHz pulse wave which is applied to the input of a counter 58. The divider 56 may be constituted by an RCA CD4027AE unit wired as shown in FIG. 5.

The counter 58 counts the 80 KHz input pulses until it is reset by a reset pulse over line 54 from circuit 48. The counter, which may be an RCA CD4040AE integrated circuit unit, has 10 output lines 60 over which the count is transferred to a storage register 62 when the register is gated by a strobe pulse over line 52 from the circuit 48. The register 62 may consist of three RCA CD4042AE integrated circuit units. The register 62 has ten output lines 64 connected to ten inputs of a digital-to-analog converter 66 such as the Analog Devices AD7520LN integrated circuit unit. The analog output of the converter 66 is applied through an operational amplifier 68 to the X input of an analog divider 70 such as the Intronics Inc. D210 unit, or the Analog Devices AD532 unit where the reciprocal is taken. The output at 32 from the divider is a control voltage which varies linearly with the frequency or repetition rate of the trigger wave applied at 44 to the input of the frequency-to-voltage converter.

OPERATION OF FIG. 2

The trigger input at 44 is a pulse wave having a frequency equal to the center frequency passed by the tracking filter of FIG. 1. The time period between two successive pulses of the trigger pulse wave is measured by counting in counter 58 and storing in register 62. The number of cycles of the 80 KHz wave which occur between the two successive pulses. The stored digital count is translated in digital-to-analog converter 66 to a corresponding time-representing voltage having an amplitude in accordance with the period of the trigger pulse wave. The divider or inverter 70 translates the time-representing voltage to a corresponding frequency-representing voltage corresponding with the frequency of the input trigger wave. The frequency-representing voltage is obtained during a single period of the trigger wave, in contrast to prior art arrangements which require a sensing of a large number of periods of a wave in order to determine its frequency or measuring less than each successive period. The frequency-representing voltage output at 32 changes without delay as the frequency of the trigger pulse wave changes.

OPERATION OF FIG. 1

The tracking filter in FIG. 1 includes a voltage-controlled filter having a signal input terminal 10, a signal output terminal 12 and a frequency control terminal 32 to which a control voltage is applied to control the frequency pass band of the filter. A suitable minimum control voltage is applied to terminal 32 from initializing circuit 34 to make the frequency pass band of the filter encompass the frequency of a minimum-frequency input signal, being applied to input terminal 10, which it is desired to lock on to or track. This is accomplished by closing the switch 38 while the potentiometer 35 is at an appropriate setting. The frequency-to-voltage converter 46 is also adjusted to supply the same minimum control voltage to the terminal 32. When the switch 38 is opened, the control voltage applied to control terminal 32 is solely determined by the feedback loop including amplifier 40, trigger 42 and frequency-to-voltage converter 46.

If the frequency of the signal applied to input terminal 10, and passed to output terminal 12, increases slightly, the control voltage produced by amplifier 40, trigger 42 and converter 46 also increases slightly and causes the pass band frequency of the filter to increase a corresponding amount, without delay. Whenever the frequency of the input signal changes, the frequency pass band of the filter immediately changes to track the changing frequency of the input signal. The tracking filter is capable of responding very rapidly to rapid change of input signal frequency because of the digital techniques employed in the frequency-to-voltage converter 46 to measure the period of each and every cycle of the signal from the filter and to then generate corresponding frequency-representing correction voltages for the voltage-controlled filter.

What is claimed is:

1. A band-pass filter having a pass band which tracks the changing frequency of an input signal, comprising
   a voltage-controlled filter including a signal input terminal, a signal output terminal and a frequency control terminal,
   a trigger circuit connected to said signal output terminal to translate the sine wave passed through said filter to a pulse wave,
   a converter receptive to said pulse wave and operative repeatedly to translate the period between successive pulses to a frequency-representing voltage, and
   means to apply said frequency-representing voltage to the frequency control terminal of said voltage-controlled filter.

2. A filter as defined in claim 1 wherein said voltage-controlled filter includes a first voltage-controlled integrator coupled from said signal input terminal to said signal output terminal, and a second voltage-controlled integrator and a constant-Q circuit coupled in parallel feedback paths from said signal output terminal to said signal input terminal.

3. A filter as defined in claim 2 wherein said converter includes a constant-frequency oscillator, a counter coupled to count the cycles from the oscillator during each interval between successive pulses from the trigger circuit, and a digital-to-analog converter and an inverter to translate each time-representing count from the counter to a frequency-representing voltage.

4. A filter as defined in claim 2 wherein said converter includes a constant-frequency oscillator, a counter coupled to count the cycles from the oscillator during each interval between successive pulses from the trigger circuit, and a digital-to-analog converter and an inverter to translate each time-representing count from the counter to a frequency-representing voltage.

5. A band-pass filter having a pass band which tracks the changing frequency of an input signal, comprising
   a voltage-controlled filter including a first voltage-controlled integrator coupled from a signal input terminal to a signal output terminal, a second voltage-controlled integrator and a constant-Q circuit coupled in parallel feedback paths from said output terminal to said input terminal,
   a trigger circuit connected to said output terminal to translate each cycle of the signal passed through said filter to a trigger pulse,
   a frequency-to-voltage converter including a constant-frequency oscillator and a counter coupled to count the cycles from the oscillator, means applying the output of said trigger circuit to reset said counter, a digital-to-analog converter to translate the maximum counts from said counter to a time-representing voltage reprsenting the time periods between successive trigger pulses, and inverter means to translate said time-representing voltage to a frequency-representing voltage, and
   means to apply said frequency-representing voltage to said first and second voltage-controlled integrators to control the frequency pass band of said filter.

6. Means for determining the frequency or repetition rate of a pulse wave, comprising a constant-frequency oscillator having a frequency much higher than the frequency of the pulse wave, a counter coupled to count the cycles from the oscillator, means employing each pulse of the pulse wave to reset said counter, and an inverter means to translate each time-representing count from the counter to a frequency-representing signal.

7. The combination as defined in claim 6 wherein said inverter means includes a digital-to-analog converter to translate each count from the counter to a time-representing voltage, and an analog signal inverter to translate the time-representing voltage to a frequency-representing voltage.

* * * * *